United States Patent [19]

Kishimoto et al.

[11] Patent Number: 4,990,584

[45] Date of Patent: Feb. 5, 1991

[54] PIEZOELECTRIC OR PYROELECTRIC MATERIAL

[75] Inventors: Manabu Kishimoto; Kenji Nakajima; Iwao Seo, all of Ibaraki, Japan

[73] Assignee: Mitsubishi Petrochemical Co., Ltd., Tokyo, Japan

[21] Appl. No.: 275,628

[22] Filed: Nov. 16, 1988

Related U.S. Application Data

[63] Continuation of Ser. No. 105,289, Oct. 7, 1987, abandoned.

[30] Foreign Application Priority Data

Oct. 9, 1986 [JP] Japan .................................. 61-240762
Feb. 6, 1987 [JP] Japan .................................. 62-25679

[51] Int. Cl.$^5$ ............................................. C08F 20/42
[52] U.S. Cl. .................................. 526/300; 252/62.9; 264/22; 428/424.7
[58] Field of Search .................. 526/300; 252/62.9; 264/22; 428/424.7

[56] References Cited

U.S. PATENT DOCUMENTS

| | | | |
|---|---|---|---|
| 2,615,866 | 10/1952 | Gilbert et al. | 526/300 |
| 2,615,867 | 10/1952 | Gilbert et al. | 526/300 |
| 2,615,868 | 10/1952 | Miller | 526/300 |
| 2,615,875 | 10/1952 | Gilbert et al. | 526/300 |
| 2,716,105 | 8/1955 | Gilbert et al. | 526/300 |
| 2,716,106 | 8/1955 | Gilbert et al. | 526/300 |
| 2,819,253 | 1/1958 | Gateff et al. | 526/300 |
| 3,145,194 | 8/1964 | Hechmaier et al. | 526/300 |
| 3,206,420 | 9/1965 | Smart et al. | 526/300 |
| 3,426,005 | 2/1969 | Serniuk et al. | 526/300 |

FOREIGN PATENT DOCUMENTS

| | | | |
|---|---|---|---|
| 0505173 | 8/1954 | Canada | 526/300 |
| 0505340 | 8/1954 | Canada | 536/300 |
| 0681120 | 10/1952 | United Kingdom | 526/300 |
| 0726068 | 3/1955 | United Kingdom | 526/300 |
| 0870195 | 6/1961 | United Kingdom | 526/300 |

Primary Examiner—Joseph L. Schofer
Assistant Examiner—J. M. Reddick
Attorney, Agent, or Firm—Oblon, Spivak, McClelland, Maier & Neustadt

[57] ABSTRACT

A vinylidene cyanide copolymer obtained by copolymerizing vinyldene cyanide represented by formula (I)

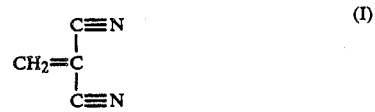

and a vinyl compound represented by formula (II)

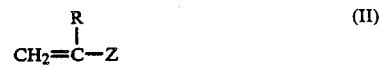

wherein Z represents a hydrogen atom or a saturated hydrocarbon group having from 1 to 6 carbon atoms; when Z is a hydrogen atom, R represents $C_nH_{2n+1}COO-$, wherein n represents 0 or an integer of from 4 to 9; and when Z is a saturated hydrocarbon group, R represents $CH_3COO-$ or a group having a benzene ring. The copolymer is excellent in transparency and provides an electret exhibiting excellent pyroelectricity or piezoelectricity upon polarization.

19 Claims, 3 Drawing Sheets

PIEZOELECTRIC OR PYROELECTRIC MATERIAL

This application is continuation of application Ser. No. 07/105,289, filed on Oct. 7, 1987, now abandoned.

FIELD OF THE INVENTION

This invention relates to a copolymer comprising vinylidene cyanide and a vinyl compound, and more particularly to a copolymer comprising vinylidene cyanide and a vinyl compound which provides transparent molded articles having high dielectric constants.

BACKGROUND OF THE INVENTION

Many copolymers comprising vinylidene cyanide and various vinyl compounds are known as described, e.g., in H. Gilbert et al., *J. Am. Chem. Soc.*, Vol. 78, 1669 (1956), but there is no report of the particular copolymer according to the present invention.

SUMMARY OF THE INVENTION

The present invention essentially provides a copolymer obtained by copolymerizing vinylidene cyanide represented by formula (I)

(I)

and a vinyl compound represented by formula (II)

(II)

wherein Z represents a hydrogen atom or a saturated hydrocarbon group having from 1 to 6 carbon atoms; when Z is a hydrogen atom, R represents $C_nH_{2n+1}COO-$, wherein n represents 0 or an integer of from 4 to 9; and when Z is a saturated hydrocarbon group, R represents $CH_3COO-$ or a group having a benzene ring.

The copolymer according to the present invention is excellent in transparency and provides an electret exhibiting excellent piezoelectricity and pyroelectricity upon polarization.

DETAILED DESCRIPTION OF THE INVENTION

Figure 1:
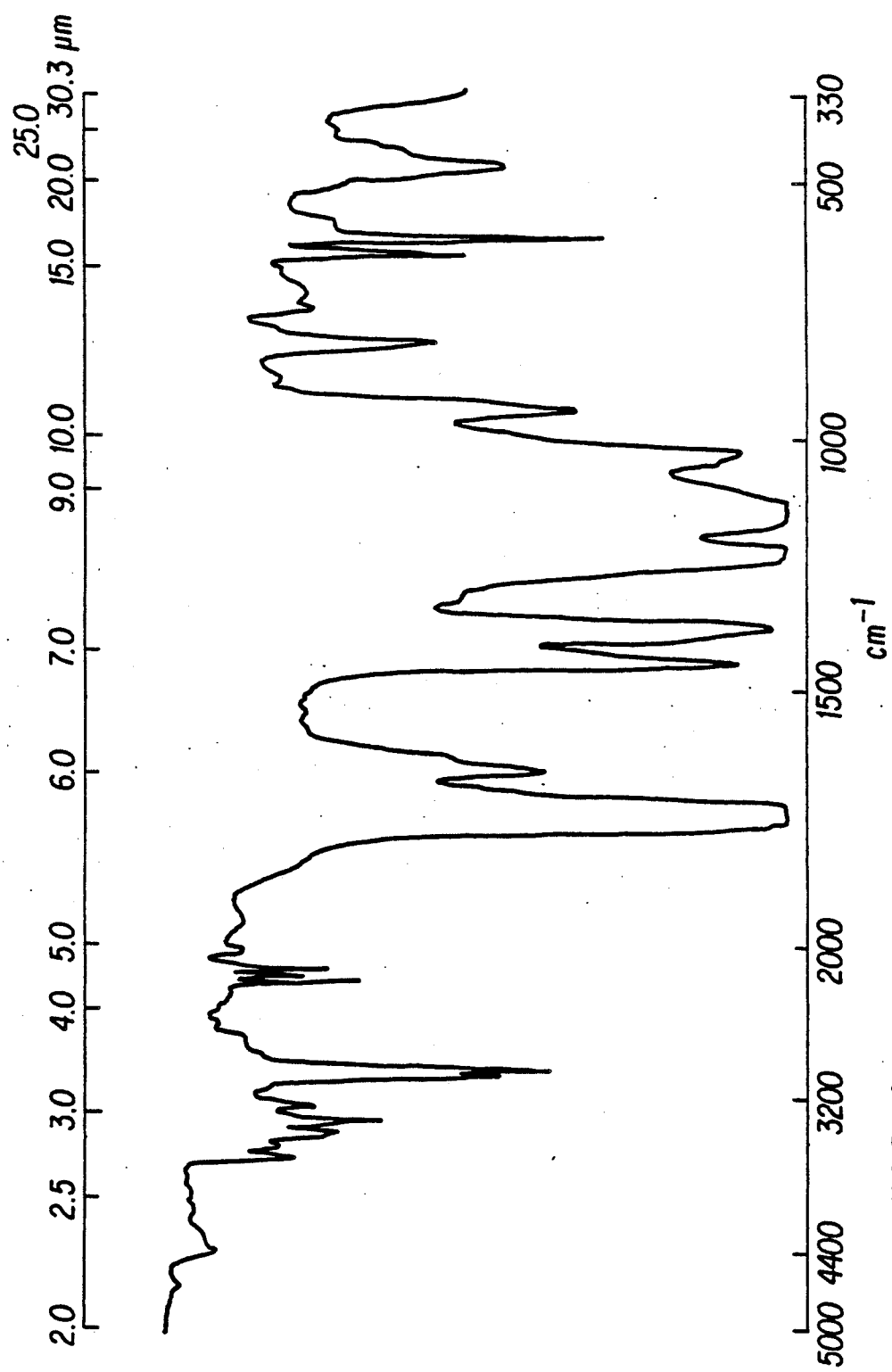
FIGS. 1 to 3 each shows an IR absorption spectrum of the copolymer obtained in Examples 1, 3, and 5, respectively. In these figures, $\nu_{co}=1740$ cm$^{-1}$ and $\nu_{CN}=2250$ cm$^{-1}$.

The vinylidene cyanide copolymer of the present invention is a random copolymer or alternating copolymer obtained by copolymerizing a vinylidene cyanide monomer represented by formula (I) and a vinyl compound monomer represented by formula (II).

The random copolymer comprises a repeating unit (B) derived from the vinyl compound and a repeating unit (A) derived from vinylidene cyanide at a (B)/(A) molar ratio of from 0.8 to 20, and preferably from 0.9 to 15.

Both the random and alternating copolymers of the present invention are low crystalline resins having a glass transition point of from 100° to 250° C., and preferably from 140° to 200° C., and a molecular weight of from 200,000 to 1,500,000, and preferably from 500,000 to 1,000,000.

In formula (II), when Z is a hydrogen atom, R represents a carboxyl group having a hydrogen atom (n=0) or a straight or branched chain saturated hydrocarbon group having from 4 to 9 carbon atoms (n=4 to 9), i.e., a butyl group, a pentyl group, a hexyl group, a heptyl group, an octyl group or a nonyl group. Preferred examples of those having a branched hydrocarbon group are groups having a secondary hydrocarbon group or a tertiary hydrocarbon group, e.g., $(CH_3)_3CCOO-$ and $(C_2H_5)_3CCOO-$.

When Z is a saturated hydrocarbon group having from 1 to 6 carbon atoms, R represents $CH_3COO-$ or a group having a benzene ring. Preferred examples of the group having a benzene ring include a phenyl group and a naphthyl group. The saturated hydrocarbon group as represented by Z may be either a straight chain group or a branched chain group having a secondary or tertiary carbon atom. Examples of the hydrocarbon groups are a methyl group and an ethyl group.

The copolymer according to the present invention can be prepared by, for example, polymerizing vinylidene cyanide and the vinyl compound of formula (II) in the presence of a radical initiator with or without a solvent. The copolymerization may also be carried out by slurry polymerization or in an ampule.

In the copolymerization, the vinyl compound is usually used in an amount of from 0.8 to 20 mols per mol of vinylidene cyanide, and preferably from 1 to 8 mols in case of obtaining an alternating copolymer and from 8 to 20 mols in case of obtaining a random copolymer.

The solvent, if used, includes an aprotic solvent, such as benzene, toluene, xylene, etc., an aliphatic hydrocarbon, such as pentane, hexane, heptane, etc., and mixtures thereof.

The polymerization temperature ranges from 0° to 150° C., and preferably from 50° to 80° C., in the case of slurry polymerization. The polymerization temperature when effected in an ampule is not particularly restricted and usually ranges from 0° to 100° C.

Any of known radical initiators can be used as a polymerization catalyst. Specific examples of useful radical initiators include oxygen; dialkyl peroxides or the derivatives thereof, e.g., di-t-butyl peroxide, t-butylcumyl peroxide, dicumyl peroxide, etc.; diacyl peroxides. e.g., diacetyl peroxide, dioctanoyl peroxide, etc.; peroxydicarbonates, e.g., diisopropyl peroxydicarbonate, di-2-ethylhexyl peroxydicarbonate, etc.; peroxy esters, e.g., t-butyl peroxyisobutyrate, t-butyl peroxypivalate, t-butyl peroxylaurate, etc.; ketone peroxides, e.g., methyl ethyl ketone peroxide, cyclohexanone peroxide, etc.; peroxy ketals, e.g., 2,2-bis-t-butyl peroxyoctane, 1,1-bis(t-butyl peroxy)cyclohexane, etc.; hydroperoxides, e.g., t-butyl hydroperoxide, cumene hydroperoxide, etc.; and azo compounds, e.g., 2,2'-azobisisobutyronitrile.

After completion of polymerization, an aprotic solvent is poured into a reaction mixture, followed by filtration. The polymer thus collected is then washed and dried to obtain the desired product.

The copolymer according to the present invention contains a cyano group and an ester group having large polarity. It can be molded by commonly employed molding methods, such as a cast molding, press molding, and injection molding. The resulting molded articles have high dielectric constants and are useful as an insulating layer for condensers, electroluminescence elements, etc. Further, molded articles having been subjected to polarization are applicable as high performance materials, such as piezoelectric or pyroelectric materials.

Further, since the molded articles obtained from the copolymer of the present invention are excellent in transparency, they are also suitable for use as optical materials, such as optical fibers and lenses, as well as optical elements taking advantage of their high dielectric constant.

The present invention will now be illustrated in greater detail with reference to the following examples, but it should be understood the present invention is not deemed to be limited thereto.

EXAMPLE 1

In a 300 ml-volume four-necked flask equipped with a stirrer, a Dimroth condenser and a thermometer were charged 10 g (0.13 mol) of vinylidene cyanide synthesized in a usual manner, 45 g (0.63 mol) of vinyl formate (produced by K & K), 25 ml of toluene, 25 ml of heptane, and several grains (several tens milligrams) of diisopropyl peroxydicarbonate, and the mixture was heated at 50° C. for 3 hours under stirring in an argon gas stream. The precipitated polymer was collected by filtration, washed successively with toluene and ethanol, and dried at 80° C. under reduced pressure overnight to obtain 10.1 g (53%) of a polymer product.

The resulting product was confirmed to be a 1:1 alternating copolymer by $^1$H-NMR analysis, $^{13}$C-NMR analysis, IR spectroscopic analysis, and elementary analysis. The IR spectrum is shown in FIG. 1. Main physical properties of the copolymer (powder) were as shown below.

Glass transition point (Tg): 152° C.
Intrinsic viscosity $[\eta]$: 0.5
Vinylidene cyanide (VDCN) content: 53 mol % (calculated from the elemental analysis results)

The powder was dissolved in dimethylacetamide (DMA), and the solution was cast to form a film. The dielectric constant of the resulting film was measured at room temperature (25° C.), and the results obtained are shown in Table 1 below.

TABLE 1

| Frequency (KHz) | Dielectric Constant |
|---|---|
| 0.1 | 5.06 |
| 1 | 4.82 |
| 100 | 4.32 |

EXAMPLE 2

In the same flask as used in Example 1 were charged 6 g (0.08 mol) of vinylidene cyanide synthesized in a usual manner, 50 g (0.4 mol) of vinyl pivalate (produced by Wako Pure Chemical Industries Ltd.), 12 ml of heptane, and 6 mg of lauroyl peroxide, and the mixture was heated at 70° C. for 4 hours under stirring in an argon gas stream. The precipitated polymer was collected by filtration, washed successively with toluene and ethanol, and dried at 80° C. under reduced pressure overnight to obtain 7.4 g (47%) of a polymer product, which was confirmed to be a 1:1 alternating copolymer by $^1$H-NMR analysis, $^{13}$C-NMR analysis, IR spectroscopic analysis, and elemental analysis. Main physical properties of the copolymer (powder) were as follows.

Tg: 171° C.
$[\eta]$: 2.2
VDCN Content: 55 mol %

The dielectric constant (25° C.) of a cast film prepared from the copolymer in the same manner as in Example 1 is shown in Table 2.

TABLE 2

| Frequency (KHz) | Dielectric Constant |
|---|---|
| 0.1 | 3.84 |
| 1 | 3.74 |
| 100 | 3.47 |

Further, the cast film was subjected to polarization and determined for piezoelectric constant ($d_{31}$). The results obtained are shown in Table 3 below.

TABLE 3

| Polarization Temperature (°C.) | Field Strength (KV/Cm) | Polarization Time (hr) | $d_{31}$ (C.G.S.e.s.u.) |
|---|---|---|---|
| 160 | 450 | 2 | $10.2 \times 10^{-8}$ |
| 160 | 600 | 2 | $12.5 \times 10^{-8}$ |
| 160 | 750 | 2 | $14.8 \times 10^{-8}$ |

EXAMPLE 3

Figure 2:
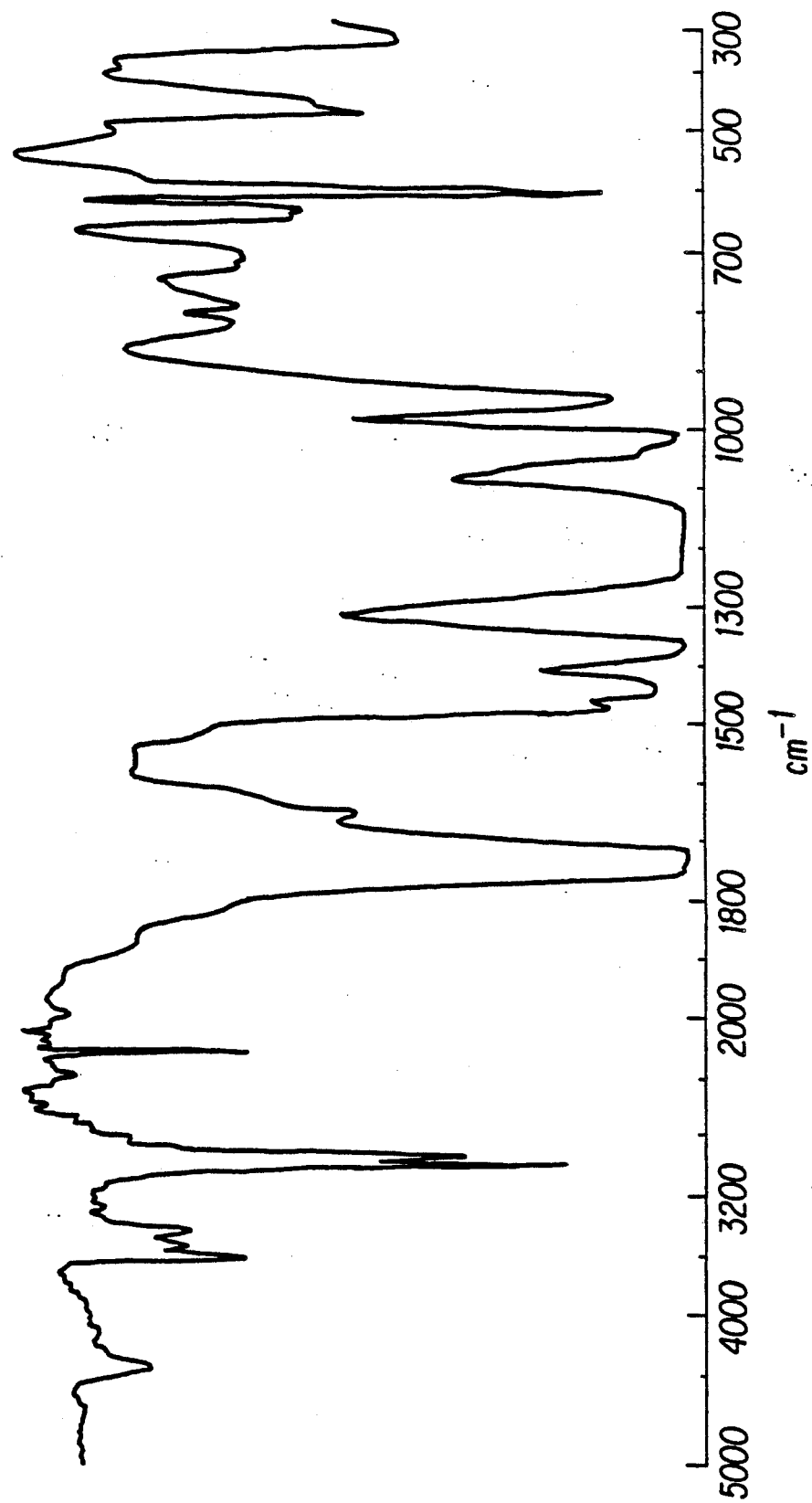

In the same flask as used in Example 1 were charged 10 g (0.13 mol) of vinylidene cyanide synthesized in a usual manner, 68 g (0.64 mol) of isopropenyl acetate (produced by Wako Pure Chemical Industries Ltd.), 20 ml of toluene, and several grains (several tens milligrams) of diisopropyl peroxydicarbonate, and the mixture was heated at 70° C. for 1 hours while stirring in an argon gas stream. The resulting viscous reaction mixture was poured into toluene, and the precipitated polymer was collected by filtration, washed successively with toluene and ethanol, and dried at 80° C. under reduced pressure overnight to obtain 12 g (53%) of a polymer product. The product was confirmed to be a 1:1 alternating copolymer by $^1$H-NMR analysis, $^{13}$C-NMR analysis, IR spectroscopic analysis, and elemental analysis. The IR spectrum is shown in FIG. 2. The main physical properties of the copolymer (powder) were as follows.

Tg: 112° C.
$[\eta]$: 0.5
VDCN Content: 50 mol %

The dielectric constant (25° C.) of a cast film obtained from the copolymer in the same manner as in Example 1 is shown in Table 4.

TABLE 4

| Frequency (KHz) | Dielectric Constant |
|---|---|
| 0.1 | 4.12 |
| 1 | 3.85 |
| 100 | 3.45 |

EXAMPLE 4

In the same flask as used in Example 1 were charged 20 g (0.26 mol) of vinylidene cyanide synthesized in a usual manner, 30 g (0.26 mol) of α-methylstyrene (produced by Wako Pure Chemical Industries Ltd.), 50 ml of toluene, and 20 mg of lauroyl peroxide, and the mixture was stirred at room temperature in an argon gas stream. At the time when heat generation subsided, the mixture was heated at 70° C. for 1.5 hours with stirring. The precipitated polymer was collected by filtration, dissolved in acetone, and reprecipitated in toluene. The precipitate was washed with ethanol and dried at 80° C. under reduced pressure overnight to obtain 7.1 g (14%) of a polymer product. The product was confirmed to be a 1:1 alternating copolymer from the results of $^1$H-NMR analysis, $^{13}$C-NMR analysis, IR spectroscopic analysis, and elemental analysis. The main physical properties of the product (powder) were as follows.

Tg: 151° C.
[η]: 0.4
VDCN Content: 52.6 mol %

The dielectric constant (25° C.) of a cast film obtained from the copolymer in the same manner as in Example 1 is shown in Table 5 below.

TABLE 5

| Frequency (KHz) | Dielectric Constant |
|---|---|
| 0.1 | 3.96 |
| 1 | 3.84 |
| 100 | 3.55 |

EXAMPLE 5

Figure 3:
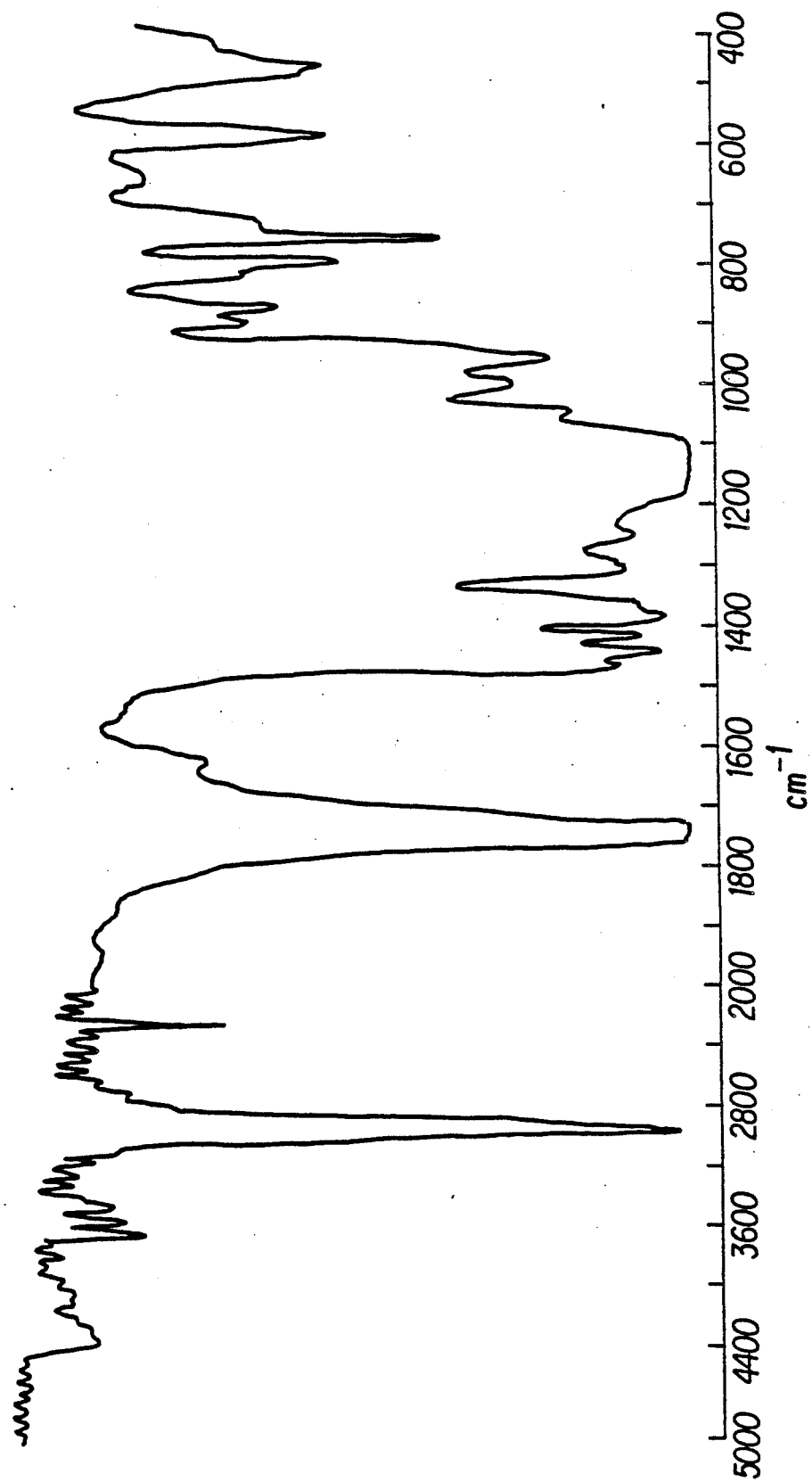

In the same flask as used in Example 1 were charged 5 g (0.06 mol) of vinylidene cyanide synthesized in a usual manner, 40 g (0.35 mol) of vinyl butyrate (produced by Tokyo Kasei K.K.), and 5 mg of lauroyl peroxide, and the mixture was heated at 70° C. for 2 hours while stirring in an argon gas stream. The precipitated polymer was collected by filtration, washed successively with toluene and ethanol, and dried at 80° C. under reduced pressure overnight to obtain 10.5 g (85%) of a polymer product. The product was confirmed to be a 1:1 alternating copolymer by $^1$H-NMR analysis, $^{13}$C-NMR analysis, IR spectroscopic analysis, and elemental analysis. The IR spectrum is shown in FIG. 3. The main physical properties of the copolymer (powder) were as follows.

Tg: 192° C.
[η]: 6.3
VDCN Content: 50 mol %

The dielectric constant (25°) of a cast film obtained from the copolymer in the same manner as in Example 1 was as shown in Table 6 below.

TABLE 6

| Frequency (KHz) | Dielectric Constant |
|---|---|
| 0.1 | 3.95 |
| 1 | 3.83 |
| 100 | 3.62 |

Further, the dielectric constant of the cast film was measured at frequency fixed to 100 Hz at various temperatures. The results obtained are shown in Table 7.

TABLE 7

| Measurement Temperature (°C.) | Dielectric Constant |
|---|---|
| 160 | 7.86 |
| 172 | 14.77 |
| 176 | 32.27 |

TABLE 7-continued

| Measurement Temperature (°C.) | Dielectric Constant |
|---|---|
| 180 | 99.71 |
| 184 | 82.11 |

The cast film was uniaxially stretched about 3 times in a silicone oil bath maintained at 190° C. and then subjected to polarization. The resulting stretched film was determined for piezoelectric constants $d_{31}$ and $K_t$. The results obtained are shown in Table 8.

TABLE 8

| Polarization Temperature (°C.) | Field Strength (KV/Cm) | Polarization Time (hr) | $d_{31}$ (C.G.S.e.s.u.) | $K_t$ (%) |
|---|---|---|---|---|
| 180 | 450 | 1 | $11.2 \times 10^{-8}$ | 8.6 |
| 180 | 600 | 1 | $13.4 \times 10^{-8}$ | 10.9 |
| 180 | 750 | 1 | $16.9 \times 10^{-8}$ | 12.4 |

EXAMPLE 6

In the same flask as used in Example 1 were charged 5 g (0.06 mol) of vinylidene cyanide synthesized in a usual manner, 50 g (0.35 mol) of vinyl hexanoate (produced by Tokyo Kasei K.K.), and 5 mg of lauroyl peroxide, and the mixture was heated at 70° C. for 3 hours with stirring in an argon gas stream. The precipitated polymer was collected by filtration, washed successively with toluene and ethanol, and dried at 80° C. under reduced pressure overnight to obtain 9.6 g (68%) of a polymer product. The product was confirmed to be a 1:1 alternating copolymer by $^1$H-NMR analysis, $^{13}$C-NMR analysis, IR spectroscopic analysis, and elemental analysis. The main physical properties of the copolymer (powder) were as follows.

Tg: 214° C.
[η]: 2.5
VDCN Content: 51 mol %

The dielectric constant (25° C.) of a cast film obtained from the copolymer in the same manner as in Example 1 was as shown in Table 9 below.

TABLE 9

| Frequency (KHz) | Dielectric Constant |
|---|---|
| 0.1 | 3.85 |
| 1 | 3.73 |
| 100 | 3.66 |

Further, the dielectric constant of the cast film was measured at a frequency fixed to 100 Hz at various temperatures. The results obtained are shown in Table 10.

TABLE 10

| Measurement Temperature (°C.) | Dielectric Constant |
|---|---|
| 188 | 5.63 |
| 192 | 12.51 |
| 196 | 28.65 |
| 200 | 95.38 |
| 204 | 78.25 |

Furthermore, the piezoelectric constants $d_{31}$ and $K_t$ were measured in the same manner as in Example 5. The results obtained are shown in Table 11.

TABLE 11

| Polarization Temperature (°C.) | Field Strength (KV/cm) | Polarization Time (hr) | $d_{31}$ (C.G.S.e.s.u.) | $K_t$ (%) |
|---|---|---|---|---|
| 200 | 450 | 1 | $10.9 \times 10^{-8}$ | 8.1 |
| 200 | 600 | 1 | $13.5 \times 10^{-8}$ | 9.9 |
| 200 | 750 | 1 | $16.5 \times 10^{-8}$ | 11.8 |

While the invention has been described in detail and with reference to specific embodiments thereof, it will be apparent to one skilled in the art that various changes and modifications can be made therein without departing from the spirit and scope thereof.

What is claimed is:

1. A piezoelectric or pyroelectric material prepared by molding a vinylidene cyanide copolymer prepared by copolymerizing vinylidene cyanide of formula (I)

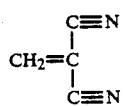

and a vinyl compound represented by formula (II)

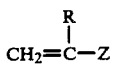

wherein Z is hydrogen or a saturated hydrocarbon group having from 1 to 6 carbon atoms; with the provisos that when z is hydrogen, R is $C_nH_{2n+1}COO-$, wherein n represents 0 or an integer of from 4 to 9, and when Z is a saturated hydrocarbon group, R is $CH_3COO-$, or a group having a benzene ring, and then polarizing said molded vinylidene cyanide polymer.

2. The piezoelectric or pyroelectric material of claim 1, wherein Z is hydrogen and n is an integer of from 4 to 9.

3. The piezoelectric or pyroelectric material of claim 1, wherein Z is hydrogen and n is an integer of from 5 to 9.

4. The piezoelectric or pyroelectric material of claim 1, wherein Z is hydrogen, n is an integer of from 4 to 9, and R contains a tertiary carbon atom.

5. The piezoelectric or pyroelectric material of claim 1, wherein Z is hydrogen, n is an integer of from 4 to 9, and R contains a secondary carbon atom.

6. The piezoelectric or pyroelectric material of claim 1, wherein Z is hydrogen and n is 5, 7 or 9.

7. The piezoelectric or pyroelectric material of claim 1, wherein Z is hydrogen and n is 4, 6 or 8.

8. The piezoelectric or pyroelectric material of claim 1, wherein Z is a saturated hydrocarbon group having from 1 to 4 carbon atoms.

9. The piezoelectric or pyroelectric material of claim 1, wherein Z is a saturated hydrocarbon group having from 1 to 3 carbon atoms.

10. The piezoelectric or pyroelectric material of claim 1, wherein Z is a saturated hydrocarbon group having 1 to 2 carbon atoms.

11. The piezoelectric or pyroelectric material of claim 1, wherein said copolymer is a 1:1 alternating copolymer.

12. The piezoelectric or pyroelectric material of claim 1, wherein said copolymer is a random copolymer.

13. The piezoelectric or pyroelectric material of claim 2, wherein said vinyl compound is vinyl formate or vinyl pivalate.

14. The piezoelectric or pyroelectric material of claim 2, wherein said vinyl compound is vinyl hexanoate.

15. The piezoelectric or pyroelectric material of claim 10, wherein said vinyl compound is isopropenyl acetate.

16. The piezoelectric or pyroelectric material of claim 10, wherein said vinyl compound is α-methylstyrene.

17. The piezoelectric or pyroelectric material of claim 12, wherein the molar ratio of repeating units derived from said vinyl compound to repeating units derived from said vinylidene cyanide ranges from 0.8 to 20 in said copolymer.

18. The piezoelectric or pyroelectric material of claim 17, wherein said molar ratio ranges from 0.9 to 15.

19. The piezoelectric or pyroelectric material prepared by molding an alternating vinylidene cyanide copolymer prepared by copolymerizing vinylidene cyanide and vinyl formate, and then polarizing said molded alternating vinylidene cyanide copolymer.

* * * * *